US008521484B2

(12) United States Patent
 Stander

(10) Patent No.: US 8,521,484 B2
(45) Date of Patent: Aug. 27, 2013

(54) CURVE MATCHING FOR PARAMETER IDENTIFICATION

(75) Inventor: Nielen Stander, Pleasanton, CA (US)

(73) Assignee: Livermore Software Technology Corp., Livermore, CA (US)

( * ) Notice: Subject to any disclaimer, the term of this patent is extended or adjusted under 35 U.S.C. 154(b) by 587 days.

(21) Appl. No.: 12/792,700

(22) Filed: Jun. 2, 2010

(65) Prior Publication Data

US 2011/0301921 A1    Dec. 8, 2011

(51) Int. Cl.
*G06F 17/00*    (2006.01)
(52) U.S. Cl.
USPC ............................................................. 703/2
(58) Field of Classification Search
None
See application file for complete search history.

(56) References Cited

U.S. PATENT DOCUMENTS

| | | | | |
|---|---|---|---|---|
| 4,653,107 A * | 3/1987 | Shojima et al. | ............... | 382/189 |
| 4,853,839 A * | 8/1989 | Nichols et al. | .................. | 700/61 |
| 5,237,649 A * | 8/1993 | Yamada | ........................ | 345/442 |
| 5,373,457 A * | 12/1994 | George et al. | ..................... | 703/2 |
| 5,566,292 A * | 10/1996 | Krembs | ........................ | 345/442 |
| 5,581,679 A * | 12/1996 | Takahashi et al. | ............. | 345/442 |
| 5,731,820 A * | 3/1998 | Broekhuijsen | ................ | 345/442 |
| 5,745,592 A * | 4/1998 | Nalwa | ........................ | 382/119 |
| 5,793,380 A * | 8/1998 | Matsuno | ....................... | 345/443 |
| 5,966,527 A * | 10/1999 | Krivokapic et al. | ............ | 703/14 |
| 6,018,591 A * | 1/2000 | Hull et al. | ..................... | 382/186 |
| 6,111,588 A * | 8/2000 | Newell | .......................... | 345/442 |
| 6,115,051 A * | 9/2000 | Simons et al. | ................. | 345/442 |
| 6,194,104 B1 * | 2/2001 | Hsu | .................................. | 430/5 |
| 6,285,805 B1 * | 9/2001 | Gueziec | ........................ | 382/299 |
| 6,404,434 B1 * | 6/2002 | Shimada et al. | ............... | 345/442 |
| 6,441,823 B1 * | 8/2002 | Ananya | .......................... | 345/442 |
| 6,512,847 B1 * | 1/2003 | Gnutzmann | .................. | 382/173 |
| 7,079,144 B1 * | 7/2006 | Shimada et al. | ............... | 345/442 |
| 7,194,394 B2 * | 3/2007 | Dorfman et al. | .................. | 703/3 |
| 7,212,205 B2 * | 5/2007 | Uesaki et | ....................... | 345/423 |
| 7,519,474 B2 * | 4/2009 | Zhou et al. | ......................... | 702/7 |
| 7,542,603 B2 * | 6/2009 | Rosel | ............................. | 382/173 |
| 7,600,212 B2 * | 10/2009 | Zach et al. | ....................... | 716/50 |
| 7,676,779 B2 * | 3/2010 | Bergamaschi et al. | ........ | 716/113 |
| 7,716,011 B2 * | 5/2010 | Thibaux et al. | ................ | 702/179 |
| 7,746,339 B2 * | 6/2010 | Matov et al. | .................... | 345/419 |
| 7,969,440 B1 * | 6/2011 | Polyakov et al. | .............. | 345/442 |
| 8,014,630 B1 * | 9/2011 | Polyakov et al. | .............. | 382/282 |

(Continued)

OTHER PUBLICATIONS

R. Jain, R. R Kasturi, B. G. Schunck, Chapter 6 Contours, Machine Vision, Published by McGraw-Hill, Inc, ISBN 0-07-032018-7, 1995, pp. 186-233.*

(Continued)

*Primary Examiner* — Saif Alhija
*Assistant Examiner* — Kibrom Gebresilassie
(74) *Attorney, Agent, or Firm* — Roger H. Chu

(57) ABSTRACT

Methods and systems for matching a computed curve to a target curve to enable realistic engineering simulations are disclosed. Discrepancies between computed curve and the target curve are measured, and based on the discrepancies, decisions on how to adjust parametric inputs can be made to achieve an optimal result of simulation. Optimization of parameter identification is achieved by adjusting the parametric inputs of a simulation model such that the discrepancy between the two curves is minimized. Because the points on the two curves to be matched are paired, matching of any two open curves, including hysteretic curves, can be handled. Curves that are complete set apart in their original coordinates can be merged to a common coordinate system for parameter identification without the computational instability problems.

8 Claims, 6 Drawing Sheets

(56) References Cited

U.S. PATENT DOCUMENTS

| | | | |
|---|---|---|---|
| 8,078,427 B2* | 12/2011 | Tischler et al. | 702/179 |
| 2002/0089521 A1* | 7/2002 | Maruyama et al. | 345/660 |
| 2003/0033105 A1* | 2/2003 | Yutkowitz | 702/105 |
| 2003/0056147 A1* | 3/2003 | Yutkowitz | 714/25 |
| 2003/0093235 A1* | 5/2003 | Dorfman et al. | 702/85 |
| 2003/0194134 A1* | 10/2003 | Wenzel et al. | 382/209 |
| 2003/0198388 A1* | 10/2003 | Wenzel et al. | 382/209 |
| 2003/0198389 A1* | 10/2003 | Wenzel et al. | 382/218 |
| 2004/0109001 A1* | 6/2004 | Grandine et al. | 345/442 |
| 2004/0109479 A1* | 6/2004 | Heinrich | 372/20 |
| 2004/0182828 A1* | 9/2004 | Schmidt et al. | 219/99 |
| 2004/0193385 A1* | 9/2004 | Yutkowitz | 702/151 |
| 2005/0024361 A1* | 2/2005 | Ikeda et al. | 345/441 |
| 2005/0156930 A1* | 7/2005 | Nishioka et al. | 345/442 |
| 2007/0143385 A1* | 6/2007 | Kurnik et al. | 708/290 |
| 2008/0031524 A1* | 2/2008 | Wenzel | 382/209 |
| 2008/0228401 A1* | 9/2008 | Zhou et al. | 702/7 |
| 2009/0027396 A1* | 1/2009 | Frisken | 345/442 |
| 2009/0027397 A1* | 1/2009 | Frisken | 345/442 |
| 2009/0027398 A1* | 1/2009 | Frisken | 345/442 |
| 2009/0299641 A1* | 12/2009 | Allawi et al. | 702/19 |
| 2010/0088788 A1* | 4/2010 | Chasiotis et al. | 850/33 |
| 2011/0301920 A1* | 12/2011 | Witowski et al. | 703/1 |
| 2012/0173216 A1* | 7/2012 | Koepsell et al. | 703/6 |

OTHER PUBLICATIONS

R. Jain, R. Kasturi, B. G. Schunck, Machine Vision, Published by McGraw-Hill, Inc, ISBN 0-07-032018-7, 1995, p. 1.*

Error Representation and Curvefitting, Oct. 13, 2006, pp. 1-7.*

K. Witowski, M. Feucht, N. Stander, "An Effective Curve Matching Metric for Parameter Identification using Partial Mapping", $8^{th}$ European LS-DYNA, Users Conference Strasbourg, pp. 1-12, printed on Dec. 6, 2012.*

* cited by examiner

CURVE MATCHING FOR PARAMETER IDENTIFICATION

FIELD OF THE INVENTION

The present invention generally relates to system identification used in engineering simulation of measured results, more particularly to methods and systems for matching a computed curve to a target curve to enable the calibration of systems or material properties, so that a realistic engineering simulation of the systems or materials can be carried out in a computer system.

BACKGROUND OF THE INVENTION

In a multiple-input dynamic model, the output is a combination of the response of each of the inputs. If the system inputs are observable, meaning the process or contribution of each input can be readily known or determined, then the output may be controlled by directly changing the related inputs. However, in a large complex system, not every input is observable. For a system with unobservable inputs, because the output cannot be directly related to an input, control and optimization of the system is more difficult. A common approach to determine how each input affects the results of an output is to measure the response of a system with known multiple inputs and try to deduce a mathematical relationship between the inputs and the outputs without going into the details about how the system reacts to each individual input. This kind of approach in determining the input-output relationship is called system identification, or parameter identification.

It is noted that "input" can also be "design". Each different "input" can be a different "design".

The goal of performing a system identification process is to produce a result that is as close to the desired physical system output as possible by adjusting the inputs of the system. In numerical simulation applications, the parameter identification, or system identification, is to control the parametric inputs of a mathematical model, which is constructed to simulate a system, such that the output of the simulation is closely matching the system output.

In certain applications, the outputs are presented in two-dimensional (2-D) curves, for example, material properties in terms of strain-stress relationship. Generally, it is desirous for a user (e.g., engineer and/or scientist) to use a computer to generate a computed or simulated curve to match a target curve (e.g., obtained in physical specimen test), such that a computer simulation can be performed to product realistic predictions.

Matching a target curve having characteristic of monotonic increase in one coordinate is very simple, for example, using the ordinate difference between two curves as a system identification parameter.

However, matching a computed curve to a non-monotonically increased target curve is not straightforward, for example, when the target curve exhibits hysteretic behaviors. In this situation, both the target curve and the computed curve have more than one possible ordinate value for each value of the abscissa. Hence, if an abscissa value is used to find the matching value on the computed curve, the interpolated ordinate value would be non-unique.

Another problem in matching two curves is related to engineering optimization. During an iterating interim stage of optimization, the computed curve and the target curves can be completely disengaged, i.e., they do not share any common value in one coordinate of a 2-D curve. Under this situation, the optimization iteration process may become computational unstable and fails.

Therefore, it would be desirable to have an improved method and system for matching a computed curve to a target curve to enable realistic engineering simulations.

SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

The present invention pertains to methods and systems for matching a computed curve to a target curve to enable realistic engineering simulations, for example, material behavior. Discrepancies between the computed curve and the target curve are measured, and based on the discrepancies, decisions on how to adjust parametric inputs can be made to achieve an optimal result of simulation. An example of a target curve in engineering simulation is a stress-strain relationship of a material obtained in a specimen test (e.g., stress versus stretch-ratio curve for polymeric material shown in FIG. 1).

Optimization of parameter identification is achieved by adjusting the parametric inputs of a simulation model such that the discrepancy between the two curves is minimized. Because the points on the two curves to be matched are paired, matching of any two open curves, including hysteretic curves, can be handled. Curves that are complete set apart in their original coordinates can be merged to a common coordinate system for parameter identification without the computational instability problems.

According to one aspect of the present invention, a target curve is represented by "m" points (a first set of points) while a computed curve represented by "n" points (a second set of points). The computed curve is created from a computer aided analysis (CAE) model (e.g., finite element analysis model) having a plurality of adjustable control or design parameters.

Coordinates of the first set and second set of points are normalized to their respective smallest bounding ranges. The segment and total lengths of each curve are calculated using the normalized coordinates. A segment length is a straight line distance between two adjacent points. The total length is the sum of all segments in each curve. The ratio between each segment length and the total length is referred to as a length ratio, which is used for creating a third set of points placed on the computed curve. Each of the third set of points is associated with corresponding one of the first set of points based on respective length ratios of the target curve. In other words, the length ratios as result of the third set of points for the computed curve matches the length ratios of the first set of points for the target curve. A discrepancy measurement is carried out between the computed curve and the target curve is then conducted in a common coordinate system. Matching of the two curves is achieved when the discrepancy measurement is within a preset tolerance. This is done by adjusting the control parameters of the simulation model.

According to one embodiment, the discrepancy measurement is a function of distances between corresponding points of two curves. According to another embodiment, the discrepancy measurement includes a volume component under each segment of the pair of adjacent points.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1-5. However, those skilled in the art will readily appreciate that the detailed description given herein with respect to these figures is for explanatory purposes as the invention extends beyond these limited embodiments.

Figure 1:
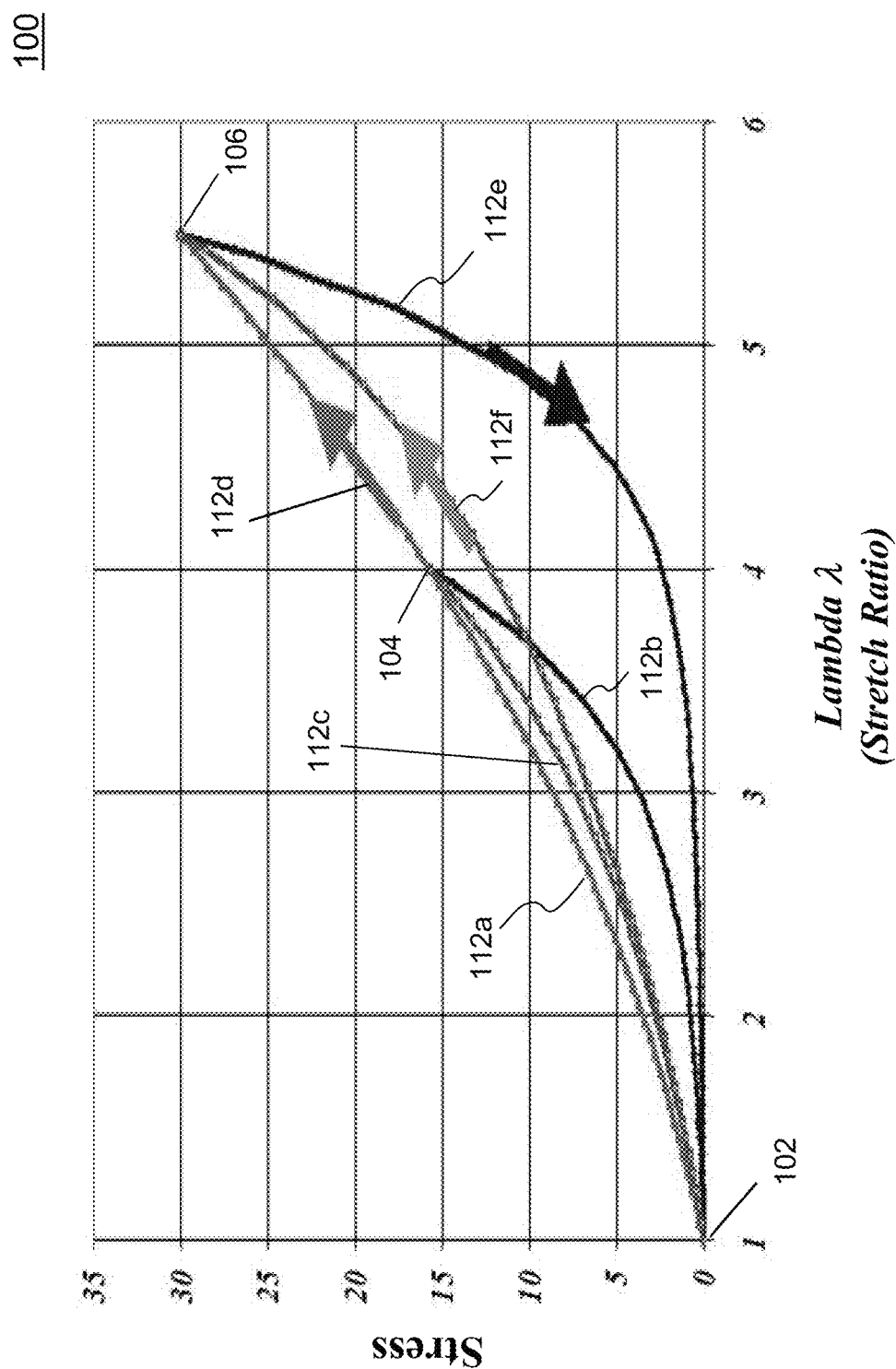
FIG. 1 is a diagram showing an exemplary target curve (stress versus stretch-ratio relationship of a polymeric material)

The present invention pertains to methods and systems for matching a computed curve to a target curve to enable the determination of input variables to a computed-aided engineering analysis model. An example is the determination of the properties (constants) of a material model used within a computer-aided engineering analysis model. Discrepancies between computed curve and the target curve are measured, and based on the discrepancies, decisions on how to adjust parametric inputs can be made to achieve an optimal result of simulation. One exemplary target curve 100 is shown in FIG. 1. The curve 100 is a typical stress versus stretch-ratio ($\sigma$-$\lambda$) relationship obtained in a specimen test of polymeric material. Stretch-ratio ($\lambda$) is another form to define strain ($\epsilon$). The relationship is defined as $\lambda = 1+\epsilon$. Curve 100 exhibits an hysteretic behavior. The $\sigma$-$\lambda$ relationship starts at an original state 102 (i.e., zero stress and stretch-ratio of one (no stretch)) following a first load path 112a to a second state 104. Unloading from the second state 104 back to the original state 102 follows a second path 112b. Reloading from the original state 102 to a third state 106 via the second state is through third and fourth paths 112c-d. From the third state 106, unloading back to the original state 102 is through a fifth path 112e. Finally, another direct reloading from the original state 102 to the third state 106 is via a sixth path 112f.

Figure 2:
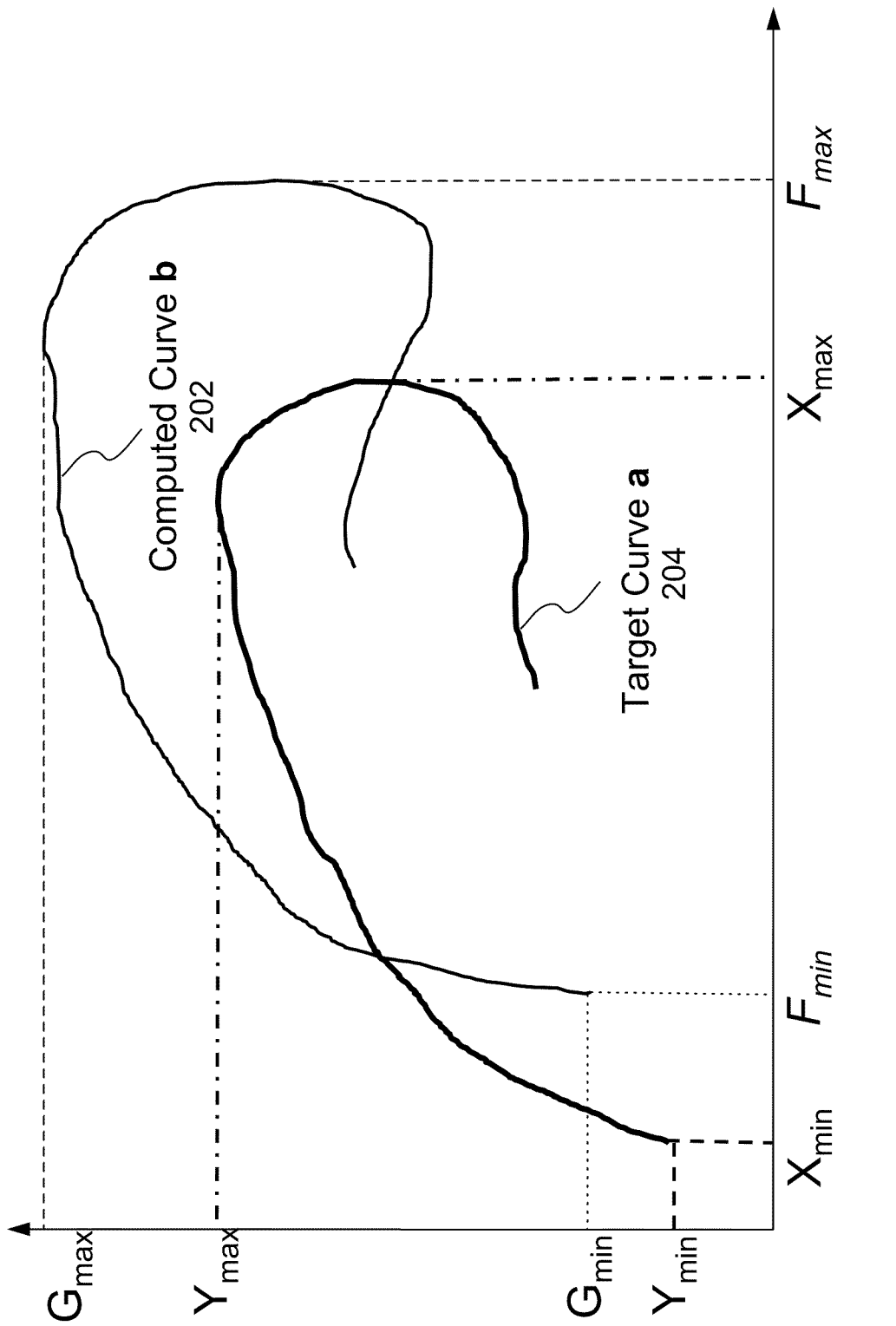
FIG. 2 is a 2-D graph showing an exemplary computed curve and a target curve to be matched, according to an embodiment of the present invention.

According to one aspect of the invention, one objective is to use a computer application to create a computed curve 202 that best matches the target curve 204. To show how this is done, FIG. 2 illustrates a computed curve 202 and a target curve 204. The target curve 204, Curve a, is bounded in a range from $X_{min}$ to $X_{max}$ and from $Y_{min}$ to $Y_{max}$. The computed curve 202, Curve b, has a bounded range from $F_{min}$ to $F_{max}$ and from $G_{min}$ to $G_{max}$. It is evident that the two curves do not have the same range in abscissa. Matching them using prior art approaches could be very difficult.

Figure 3:
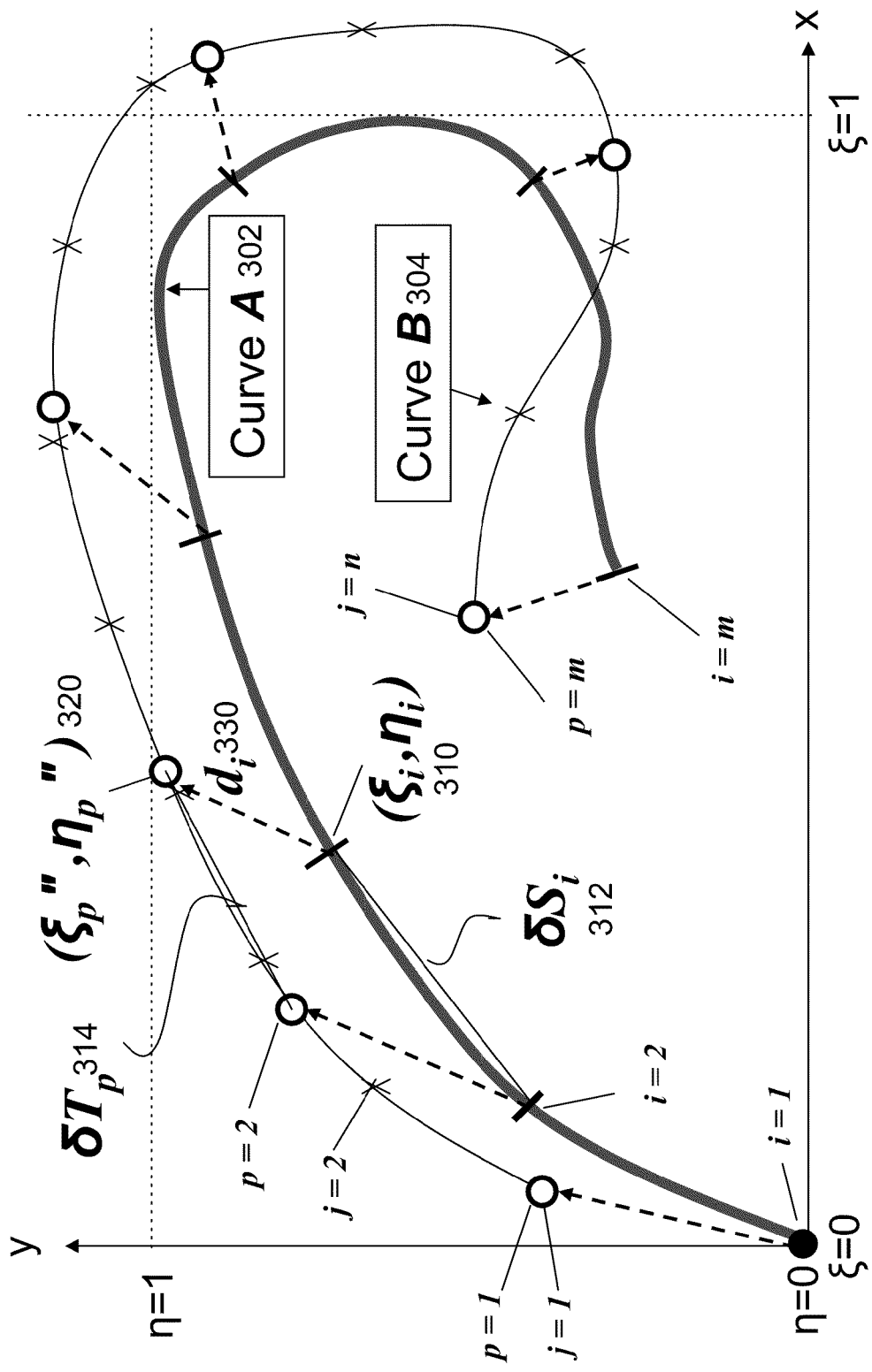
FIG. 3 is a 2-D graph showing exemplary computed and target curves in a common normalized coordinate system and the mapping relationship between the two curves, according to an embodiment of the invention.

Referring now to FIG. 3, it is shown a computed 302 and target curves 304 in a common normalized coordinate ($\xi$-$\eta$) system using a mapping scheme, according to an embodiment of the present invention. Curve A 302, a normalized target curve, is defined by a first set of points ("m" points, shown as i=1, 2, ... m, denoted by "|"). Curve B 304, a normalized computed curve, is defined by a second set of points ("n" points, shown as j=1, 2, ... n, denoted by "X") with a third set of points ("m" points shown as p=1, 2, ... m, denoted by circle) mapped thereon. A segment is defined by a straight line between two adjacent points. For example, $\delta S_i$ 312 is a segment of the target curve 302, while $\delta T_p$ 314 is a segment of the computed curve 304.

The mapping scheme is summarized in the following procedure:

1) Normalize coordinates i of the first set of points of target curve a (FIG. 2) to its smallest
bounding ranges to create Curve A 302.

$$\xi_i = \frac{X_i - X_{min}}{X_{max} - X_{min}}; \eta_i = \frac{Y_i - Y_{min}}{Y_{max} - Y_{min}} \quad (1)$$

$$X_{min} = \min_k X_k; X_{max} = \max_k X_k$$

$$Y_{min} = \min_k Y_k; Y_{max} = \max_k Y_k$$

2) Normalize coordinates j of the second set of points of computed curve b (FIG. 2) to its smallest bounding ranges to create Curve B 304.

$$\xi'_j = \frac{F_i - F_{min}}{F_{max} - F_{min}}; \eta'_j = \frac{G_i - G_{min}}{G_{max} - G_{min}} \quad (2)$$

$$F_{min} = \min_k F_k; F_{max} = \max_k F_k$$

$$G_{min} = \min_k G_k; G_{max} = \max_k G_k$$

3) Compute S, the total length of Curve A 304. Also compute the individual segment lengths $\delta S_i$ 314:

$$\delta S_i = \sqrt{(\xi_i - \xi_{i-1})^2 + (\eta_i - \eta_{i-1})^2}; i = 2, 3, \ldots, m \tag{3}$$

A segment is defined as a part of the curve between two adjacent points, connected by a straight line.

4) Create a length ratio of each segment to the total length S:

$$\tilde{s}_i = \delta S_i / S; i = 2, 3, \ldots, m \tag{4}$$

5) Calculate total length T of Curve B 304.

6) Map each point on Curve A 302 to Curve B 304 using the following formula:

$$\tilde{s}_i \times T = \delta T_p; i = p = 2, 3, \ldots, m \tag{5}$$

A typical segment on Curve B 304 corresponds to a segment i of Curve A 302 has length $\delta T_p$ 314.

7) Denormalize the newly mapped computed curve by transforming it to its original coordinate system, but now represented by the third set of points which are mapped from the target curve.

$$x_p = F_{min} + \xi_i'(F_{max} - F_{min}); y_p = G_{min} + \eta_i'(G_{max} - G_{min}) \tag{6}$$

8) Transform the resulting curve to the same coordinate system (i.e., a common coordinate system) as the normalized target curve A 302. The third set of points now have coordinates as follows:

$$\xi_p'' = \frac{x_p - X_{min}}{X_{max} - X_{min}}; \eta_p'' = \frac{y_p - Y_{min}}{Y_{max} - Y_{min}} \tag{7}$$

The two curves are now in a common coordinate system and can be presented in the same graph as shown in FIG. 3. With the initial point of both curves positioned at the origin, the discrepancy between the two curves can be obtained by comparing the point pairs (i.e., ($\xi$, $\eta$) 310 and ($\xi''$, $\eta''$) 320).

According to one embodiment of the invention, the distance 330 between each point pair is calculated as:

$$d_i = \sqrt{(\xi_p'' - \xi_i)^2 + (\eta_p'' - \eta_i)^2} \tag{8}$$

and the volume component between the two curves is quantified by the sum of the areas between each segment pairs as $$v_i = \frac{d_i + d_{i-1}}{2} \times \tilde{s}_i; v_1 = 0; i = 2, 3, \ldots, m \tag{9}$$

The discrepancy between two curves can be measured in a number of manners, for example, sum of the volume components, maximum of all the components, and alike.

Because the points used to calculate the discrepancies between the target and the computed curves are paired, there is no requirement for the abscissa to be monotonic. Open curves with hysteretic characteristics can also be matched without difficulties. The calculated discrepancy is linear with respect to the curve parameters when a large number of curve points are used. Therefore, the parameter identification of a linear system can be done in single step. Also, because the comparison of the two curves are based on a one-to-one mapping of the points on the target curve on a common coordinate system, even if the computed curve is completely set apart from the target curve, the discrepancy calculation from the transformed and normalized point pairs provides a reliable and robust measurement. The unstable computational in the traditional methods is avoid.

As the discrepancy between the computed and the target curves is determined, the optimization of the simulation can be performed by adjusting the parameters of the CAE model such that the discrepancy is minimized within a preset tolerance.

Figure 4A:
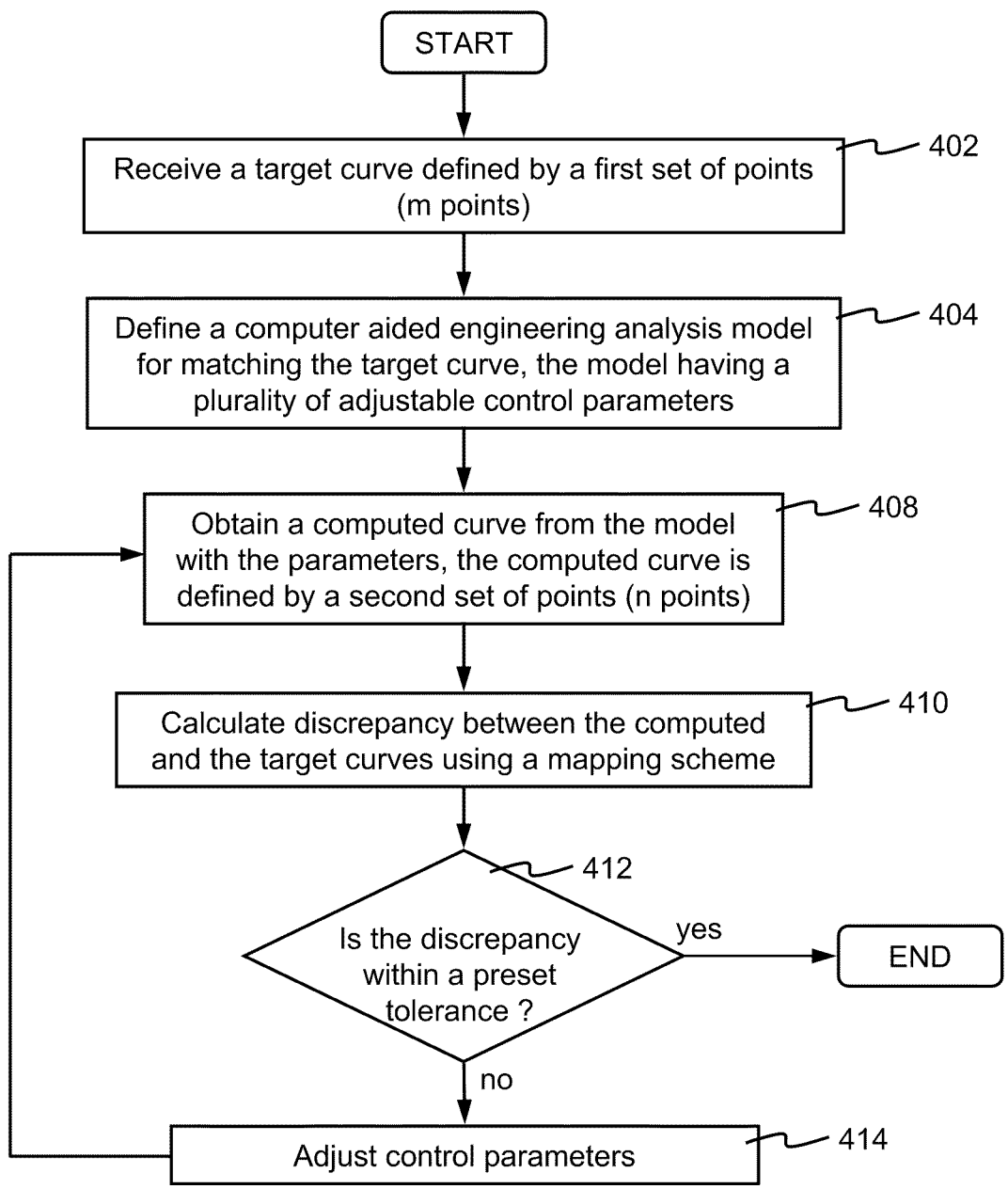
FIGS. 4A and 4B collectively shows a flowchart illustrating an exemplary process of matching a computed curve to a target curve to enable realistic engineering simulation, according to an embodiment of the invention.

FIG. 4A is a flowchart showing an exemplary optimization process 400 for matching a computed curve to a target curve using a computer aided engineering analysis model to enable realistic engineering simulation, according to an embodiment of the present invention. Process 400 is preferably implemented in software.

Process 400 starts by receiving a target curve at step 402. The target curve is defined by a first set of points (e.g., "m" points shown in FIG. 3). One exemplary target curve is strain-stress relationship curve obtained in a material specimen test (e.g., FIG. 1). At step 404, a computer aided engineering (CAE) model (e.g., finite element analysis (FEA) model) is defined for matching the target curve. The CAE model includes a number of control adjustable parameters that can be adjusted as a means for matching a computed curve to the target curve. The computed curve is first obtained using the CAE model with the initial set of parameters at step 408. The computed curve is defined by a second set of points (e.g., "n" points shown in FIG. 3). Generally, there is no requirement as to how the first set of points and the second set of points relate to each other. In other words, "m" and "n" can be different. Further, there is no requirement as to how the first and second sets of points are distributed, for example, points can be arbitrarily distributed on their respective curves.

Next, a discrepancy is measured between the computed and target curves using a mapping scheme at step 410. Details of the mapping scheme are described in FIG. 4B and corresponding descriptions below. At decision 412, it is determined whether the discrepancy is below a tolerance. If not, the parameters of the CAE model are adjusted at step 414 for creating another computed curve. Process 400 moves back to step 408 to repeat until decision 412 becomes true. Process 400 ends thereafter.

Figure 4B:
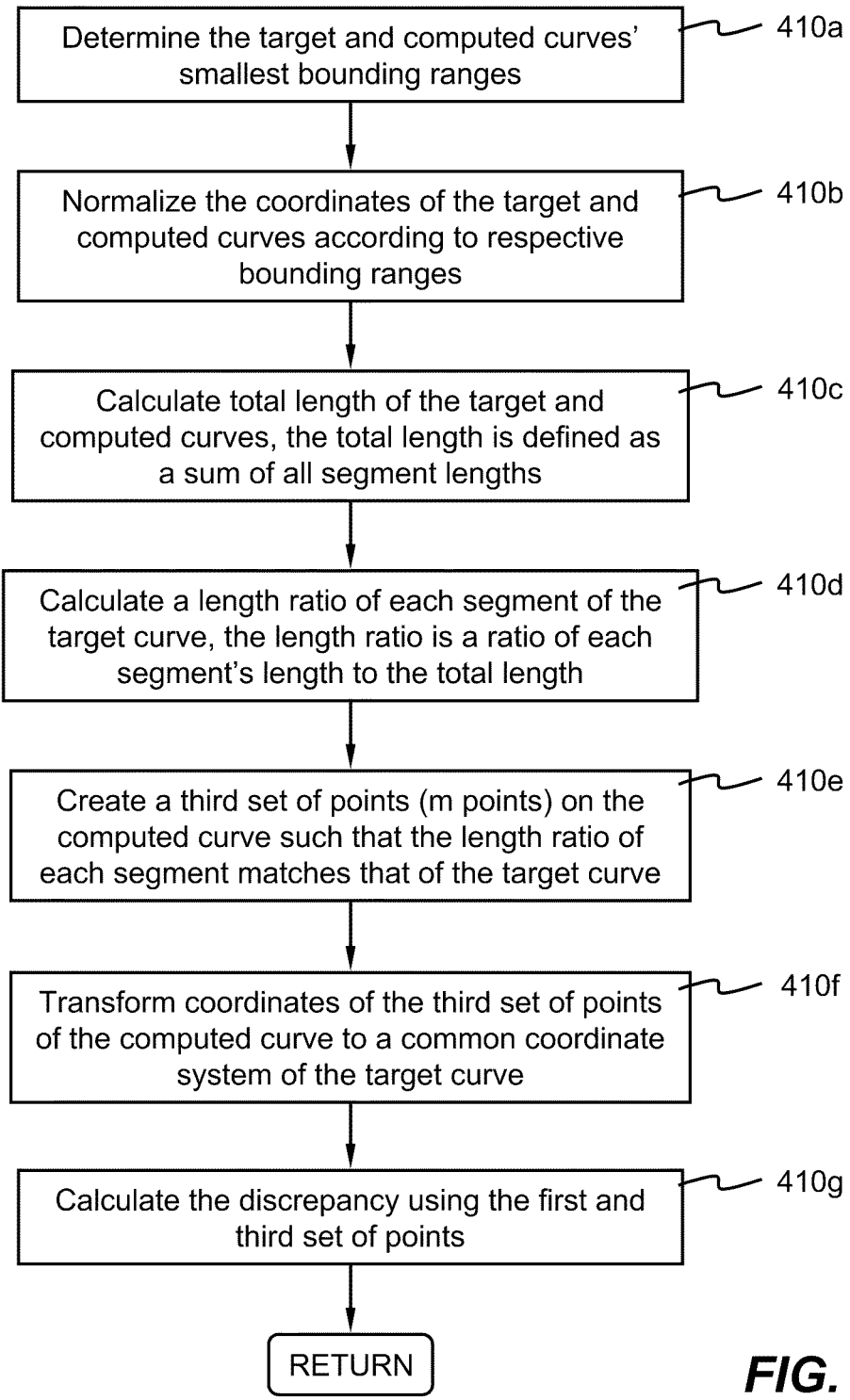

FIG. 4B shows the details the mapping scheme of step 410 for calculating the discrepancy between the computed and the target curves. At 410a, the smallest bounding ranges of the target and the computed curves are determined (FIG. 2). At 410b, the first and second sets of points on the target and on the computed curves are normalized to their respective bounding ranges according to Equations (1) and (2) respectively. At 410c, the length of each segment defined by two adjacent points on the target curve is calculated (Equation (3)) and accordingly the total length S of the target curve is obtained by summing all the segment length. The total length T of the computed curve is also calculated. At 410d, a length ratio of each segment to the total length of the target curve is calculated (Equation (4)). At step 410e, the third set of points is created using the length ratio according to Equation (5) on the computed curve. At 410f, the third set of points on the computed curve are converted back to the original coordinate system (Equation (6)) and then normalized to the bounding ranges of the target curve as shown in Equation (7). Discrepancy is calculated using the point pairs between the first and third sets of points according to Equations (8)-(9) at 410g. The calculated discrepancy is then carried to decision 412 of FIG. 4A.

Figure 5:
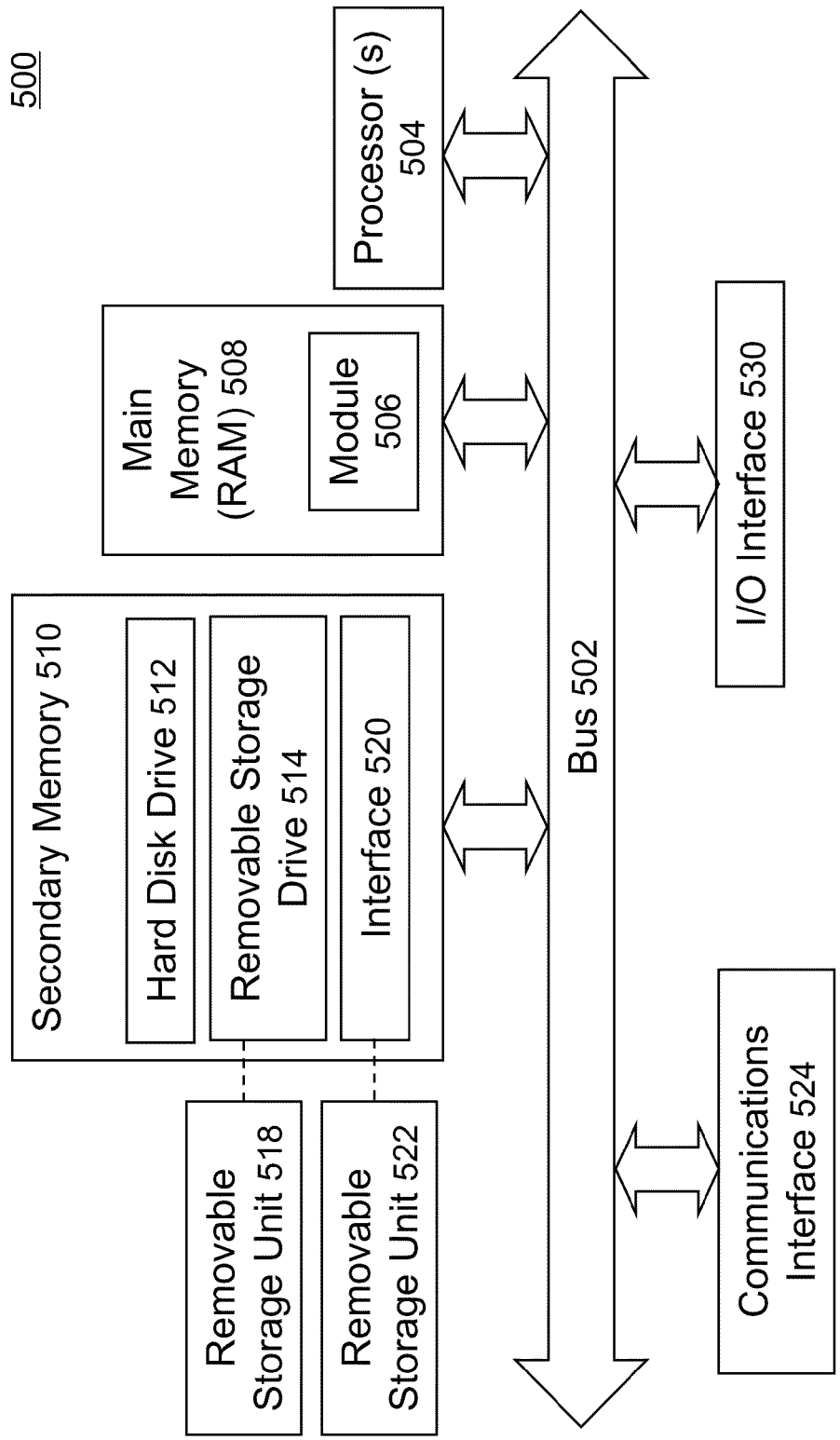
FIG. 5 is a functional block diagram depicting salient components of a computer system used for implementing one embodiment of the invention.

According to one embodiment, the present invention is directed towards one or more computer systems capable of carrying out the functionality described herein. An example of a computer system 500 is shown in FIG. 5. The computer system 500 includes one or more processors, such as processor 504. The processor 504 is connected to a computer system internal communication bus 502. Various software embodiments are described in terms of this exemplary computer system. After reading this description, it will become apparent to a person skilled in the relevant art(s) how to implement the invention using other computer systems and/or computer architectures.

Computer system 500 also includes a main memory 508, preferably random access memory (RAM), and may also include a secondary memory 510. The secondary memory 510 may include, for example, one or more hard disk drives 512 and/or one or more removable storage drives 514, representing a floppy disk drive, a magnetic tape drive, an optical disk drive, etc. The removable storage drive 514 reads from and/or writes to a removable storage unit 518 in a well-known manner. Removable storage unit 518, represents a floppy disk, magnetic tape, optical disk, etc. which is read by and written to by removable storage drive 514. As will be appreciated, the removable storage unit 518 includes a computer usable storage medium having stored therein computer software and/or data.

In alternative embodiments, secondary memory 510 may include other similar means for allowing computer programs or other instructions to be loaded into computer system 500. Such means may include, for example, a removable storage unit 522 and an interface 520. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 522 and interfaces 520 which allow software and data to be transferred from the removable storage unit 522 to computer system 500. In general, Computer system 500 is controlled and coordinated by operating system (OS) software, which performs tasks such as process scheduling, memory management, networking and I/O services.

There may also be a communications interface 524 connecting to the bus 502. Communications interface 524 allows software and data to be transferred between computer system 500 and external devices. Examples of communications interface 524 may include a modem, a network interface (such as an Ethernet card), a communication port, a Personal Computer Memory Card International Association (PCMCIA) slot and card, etc. Software and data transferred via communications interface 524. The computer 500 communicates with other computing devices over a data network based on a special set of rules (i.e., a protocol). One of the common protocols is TCP/IP (Transmission Control Protocol/Internet Protocol) commonly used in the Internet. In general, the communication interface 524 manages the assembling of a data file into smaller packets that are transmitted over the data network or reassembles received packets into the original data file. In addition, the communication interface 524 handles the address part of each packet so that it gets to the right destination or intercepts packets destined for the computer 500. In this document, the terms "computer program medium", "computer readable medium", "computer recordable medium" and "computer usable medium" are used to generally refer to media such as removable storage drive 514 (e.g., flash storage drive), and/or a hard disk installed in hard disk drive 512. These computer program products are means for providing software to computer system 200. The invention is directed to such computer program products.

The computer system 500 may also include an input/output (I/O) interface 530, which provides the computer system 500 to access monitor, keyboard, mouse, printer, scanner, plotter, and alike.

Computer programs (also called computer control logic) are stored as application modules 506 in main memory 508 and/or secondary memory 510. Computer programs may also be received via communications interface 524. Such computer programs, when executed, enable the computer system 500 to perform the features of the present invention as discussed herein. In particular, the computer programs, when executed, enable the processor 504 to perform features of the present invention. Accordingly, such computer programs represent controllers of the computer system 500.

In an embodiment where the invention is implemented using software, the software may be stored in a computer program product and loaded into computer system 500 using removable storage drive 514, hard drive 512, or communications interface 524. The application module 506, when executed by the processor 504, causes the processor 504 to perform the functions of the invention as described herein.

The main memory 508 may be loaded with one or more application modules 506 that can be executed by one or more processors 504 with or without a user input through the I/O interface 530 to achieve desired tasks. In operation, when at least one processor 504 executes one of the application modules 506, the results are computed and stored in the secondary memory 510 (i.e., hard disk drive 512). The status of the analysis (e.g., computed curve) is reported to the user via the I/O interface 530 either in a text or in a graphical representation upon user's instructions.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas two-dimensional curves have been shown and described, other types of curves may be used instead, for example, three-dimensional curves. Additionally, the calibration of material properties has been shown and described, other types of system can be used instead, for example, a target curve representing a desired system behavior to be matched by tweaking certain design parameters. Furthermore whereas the steps for matching the two curves has been shown and described as a group of equations (Equations (1)-(9)), other equivalent mathematical descriptions of material behaviors can be used instead. In summary, the scope of the invention should not be restricted to the specific exemplary embodiments disclosed herein, and all modifications that are readily suggested to those of ordinary skill in the art should be included within the spirit and purview of this application and scope of the appended claims.

I claim:

1. A method executed in a computer system for matching a computed curve to a target curve representing material behaviors in engineering simulations, the method comprising:
   receiving a definition of a target curve in a computer system, the target curve being defined by a first set of points;
   obtaining a computed curve using a computer aided engineering analysis model in an engineering simulation configured for creating the computed curve via a plurality of control parameters of the engineering simulation, the computed curve being defined by a second set of points;
   creating a third set of points on the computed curve using a mapping scheme that includes:
   a) normalizing coordinates of the first set of points using the target curve's smallest bounding range into a normalized coordinate system of the target curve;

b) normalizing coordinates of the second set of points using the computed curve's smallest bounding range;
c) calculating the target curve's total length by adding up respective segment lengths of all segments of the target curve using the normalized coordinates of the first set of points, each of the segments being a part of the target curve between two adjacent points in the first set;
d) calculating a segment length ratio of each of the segments of the target curve by dividing the corresponding segment length by the target curve's total length;
e) calculating the computed curve's total length using the normalized coordinates of the second set of points;
f) placing the third set of points on the computed curve based on respective coordinates derived by multiplying the corresponding segment length ratio to the computed curve's total length;
g) transforming the third set of points back to the computed curve's original coordinate system; and
h) transforming the third set of points into the normalized coordinate system of the target curve;

iteratively updating the computed curve defined by the newly created third set of points by adjusting the control parameters until a discrepancy between the computed and target curves is within a tolerance, the discrepancy is calculated using the third set and the first set of points; and storing the control parameters along with the computer aided engineering analysis model into a file on a storage device coupled to the computer system upon user's instructions.

2. The method of claim 1, wherein the segment length of a particular segment is defined by a straight line between corresponding two adjacent points on the target curve.

3. The method of claim 1, wherein the discrepancy is a function of distances between corresponding points between the first set of points and the third set of points in the normalized coordinate system of the target curve.

4. The method of claim 3, wherein the discrepancy between the target curve and the computed curve is a sum of areas between each segment on the target curve and its corresponding segment on the computed curve.

5. The method of claim 3, wherein the discrepancy between the target curve and the computed curve is the largest distance among distances between each point on the target curve and its corresponding point on the computed curve.

6. The method of claim 1, wherein the target curve is a strain-stress relationship curve of a material obtained in a specimen test.

7. A system for matching a computed curve to a target curve representing material behaviors in engineering simulations, the system comprising:
a memory for storing computer readable code for one or more application modules;
at least one processor coupled to the memory, said at least one processor executing the computer readable code in the memory to cause the one or more application modules to perform operations of:
receiving a definition of a target curve, the target curve being defined by a first set of points;
obtaining a computed curve using a computer aided engineering analysis model in an engineering simulation configured for creating the computed curve via a plurality of control parameters of the engineering simulation, the computed curve being defined by a second set of points;
creating a third set of points on the computed curve using a mapping scheme that includes:
a) normalizing coordinates of the first set of points using the target curve's smallest bounding range into a normalized coordinate system of the target curve;
b) normalizing coordinates of the second set of points using the computed curve's smallest bounding range;
c) calculating the target curve's total length by adding up respective segment lengths of all segments of the target curve using the normalized coordinates of the first set of points, each of the segments being a part of the target curve between two adjacent points in the first set;
d) calculating a segment length ratio of each of the segments of the target curve by dividing the corresponding segment length by the target curve's total length;
e) calculating the computed curve's total length using the normalized coordinates of the second set of points;
f) placing the third set of points on the computed curve based on respective coordinates derived by multiplying the corresponding segment length ratio to the computed curve's total length;
g) transforming the third set of points back to the computed curve's original coordinate system; and
h) transforming the third set of points into the normalized coordinate system of the target curve;

iteratively updating the computed curve defined by the newly created third set of points by adjusting the control parameters until a discrepancy between the computed and target curves is within a tolerance, the discrepancy is calculated using the third set and the first set of points; and storing the control parameters along with the computer aided engineering analysis model into a file on a storage device coupled to the system upon user's instructions.

8. A computer readable non-transitory storage medium containing computer executable instructions for controlling a computer system for matching a computed curve to a target curve representing material behaviors in engineering simulations by a method comprising:
receiving a definition of a target curve in a computer system, the target curve being defined by a first set of points;
obtaining a computed curve using a computer aided engineering analysis model in an engineering simulation configured for creating the computed curve via a plurality of control parameters of the engineering simulation, the computed curve being defined a second set of points;
creating a third set of points on the computed curve using a mapping scheme that includes:
a) normalizing coordinates of the first set of points using the target curve's smallest bounding range into a normalized coordinate system of the target curve;
b) normalizing coordinates of the second set of points using the computed curve's smallest bounding range;
c) calculating the target curve's total length by adding up respective segment lengths of all segments of the target curve using the normalized coordinates of the first set of points, each of the segments being a part of the target curve between two adjacent points in the first set;

d) calculating a segment length ratio of each of the segments of the target curve by dividing the corresponding segment length by the target curve's total length;
e) calculating the computed curve's total length using the normalized coordinates of the second set of points;
f) placing the third set of points on the computed curve based on respective coordinates derived by multiplying the corresponding segment length ratio to the computed curve's total length;
g) transforming the third set of points back to the computed curve's original coordinate system; and
h) transforming the third set of points into the normalized coordinate system of the target curve;

iteratively updating the computed curve defined by the newly created third set of points by adjusting the control parameters until a discrepancy between the computed and target curves is within a tolerance, the discrepancy is calculated using the third set and the first set of points; and storing the control parameters along with the computer aided engineering analysis model into a file on a storage device coupled to the computer system upon user's instructions.

* * * * *